United States Patent
Furuta

(10) Patent No.: US 12,062,575 B2
(45) Date of Patent: Aug. 13, 2024

(54) WAFER PROCESSING METHOD

(71) Applicant: DISCO CORPORATION, Tokyo (JP)

(72) Inventor: Kenji Furuta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 394 days.

(21) Appl. No.: 17/447,587

(22) Filed: Sep. 14, 2021

(65) Prior Publication Data

US 2022/0102216 A1 Mar. 31, 2022

(30) Foreign Application Priority Data

Sep. 28, 2020 (JP) .................................. 2020-162153

(51) Int. Cl.
*H01L 21/78* (2006.01)
*H01L 21/3065* (2006.01)
*H01L 21/67* (2006.01)

(52) U.S. Cl.
CPC .......... *H01L 21/78* (2013.01); *H01L 21/3065* (2013.01); *H01L 21/67069* (2013.01)

(58) Field of Classification Search
CPC ........... H01L 21/3065; H01L 21/67069; H01L 21/67092; H01L 21/67132; H01L 21/78–786; H01L 21/3043; H01L 24/97; H01L 2224/97; H01L 24/96; H01L 2224/96

See application file for complete search history.

(56) References Cited

U.S. PATENT DOCUMENTS

2016/0163597 A1* 6/2016 Yamashita .............. H01L 21/78
438/462
2019/0393089 A1* 12/2019 Zhao ........................ C09J 7/241

FOREIGN PATENT DOCUMENTS

| JP | 2000182995 A | 6/2000 |
| JP | 2003338467 A | 11/2003 |
| JP | 2006140303 A | 6/2006 |
| JP | 2013179316 A | 9/2013 |
| JP | 2014212282 A | 11/2014 |
| JP | 2018206936 A | 12/2018 |

OTHER PUBLICATIONS

Office Action issued in counterpart Japanese patent application No. 2020-162153, dated Jun. 4, 2024.

* cited by examiner

*Primary Examiner* — Mohammad A Rahman
(74) *Attorney, Agent, or Firm* — Greer Burns & Crain Ltd.

(57) ABSTRACT

A wafer processing method includes an adhesive film bonding step of bonding an adhesive film on a side of a back surface of the wafer, an adhesive film cutting-off step of cutting off at least the adhesive film that is bonded on the side of the back surface of the wafer along streets from the side of the back surface of the wafer, a modified layer forming step of irradiating a laser beam of a wavelength that has transmissivity through the wafer with the laser beam focused inside the wafer, so that modified layers are formed along the streets, respectively, and a dividing step of, after performing the adhesive film cutting-off step and the modified layer forming step, applying an external force to the wafer so that the wafer is divided from the modified layers as starting points.

9 Claims, 9 Drawing Sheets

WAFER PROCESSING METHOD

BACKGROUND OF THE INVENTION

Field of the Invention

The present invention relates to a wafer processing method.

Description of the Related Art

A die bonding method is widely adopted. According to this die bonding method, a semiconductor wafer with a sheet-shaped adhesive film, which is called "Die Attach Film (DAF)," bonded beforehand on a back surface of the semiconductor wafer is divided into individual devices to form semiconductor chips with the DAF bonded on back surfaces thereof, and the semiconductor chips are mounted by die bonding on a board via the DAF on the back surfaces (see Japanese Patent Laid-Open 2000-182995).

As a method for dividing the wafer, there is known a method in which a DAF and an expandable sheet are bonded on a back surface of a wafer, and after formation of modified layers by a laser beam of a wavelength having transmissivity through the wafer, the expandable sheet is expanded to break the DAF (see JP 2003-338467 A).

SUMMARY OF THE INVENTION

If the chip size is small, however, an expansion of the expandable sheet causes only a small amount of stretch, leading to a problem that a region or regions may remain unable to assure breakage of the DAF.

The present invention therefore has as an object thereof the provision of a wafer processing method, which can assure breakage of a DAF even if the chip size is small.

In accordance with an aspect of the present invention, there is provided a wafer processing method having devices in respective regions defined by a plurality of intersecting streets on a front surface thereof. The processing method includes an adhesive film bonding step of bonding an adhesive film on a side of a back surface of the wafer, an adhesive film cutting-off step of cutting off at least the adhesive film that is bonded on the side of the back surface of the wafer along the streets from the side of the back surface of the wafer, a modified layer forming step of irradiating a laser beam of a wavelength that has transmissivity through the wafer with the laser beam focused inside the wafer, so that modified layers are formed along the streets, respectively, and a dividing step of, after performing the adhesive film cutting-off step and the modified layer forming step, applying an external force to the wafer so that the wafer is divided from the modified layers as starting points.

Preferably, the wafer processing method may further include a front side tape bonding step of bonding a front side tape to a side of a front surface of the wafer, before or after the adhesive film bonding step.

In the modified layer forming step, a laser beam of a wavelength that has transmissivity through the front side tape and the wafer may preferably be irradiated from the side of the front surface of the wafer across the front side tape.

Preferably, the dividing step may include a breaking step of rolling and moving a breaking roller while pressing the wafer by the braking roller via the front side tape on the wafer so that the wafer is divided from the modified layers as the starting points.

Preferably, the front side tape may have stretchability, and the dividing step may include an expanding step of expanding the front side tape on the wafer so that the wafer is divided into device chips from the modified layers as the starting points.

Preferably, the wafer processing method may further include a mounting step of providing a mounting board, on which desired ones of the device chips are to be mounted, at a position where the mounting board faces the desired device chips, and pressing the desired device chips toward the mounting board via the front side tape so that the desired device chips are mounted onto the mounting board by the adhesive film arranged on a side of back surfaces of the desired device chips.

Preferably, the wafer processing method may further include a back side tape bonding step of, after performance of the adhesive film cutting-off step, bonding a back side tape to the side of the back surface of the wafer via the adhesive film.

Preferably, the dividing step may include a breaking step of rolling and moving a breaking roller while pressing the wafer by the braking roller via the back side tape on the wafer so that the wafer is divided from the modified layers as the starting points.

Preferably, the back side tape may have stretchability, and the dividing step may include an expanding step of expanding the back side tape on the wafer so that the wafer is divided into device chips from the modified layers as the starting points.

According to the present invention, the adhesive film, in other words, the DAF can be surely broken even if the chip size is small.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

With reference to the drawings, a description will hereinafter be made in detail about an embodiment of the present invention. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Furthermore, various omissions, replacements, and modifications of configurations can be made without departing from the spirit of the present invention.

Figure 1:
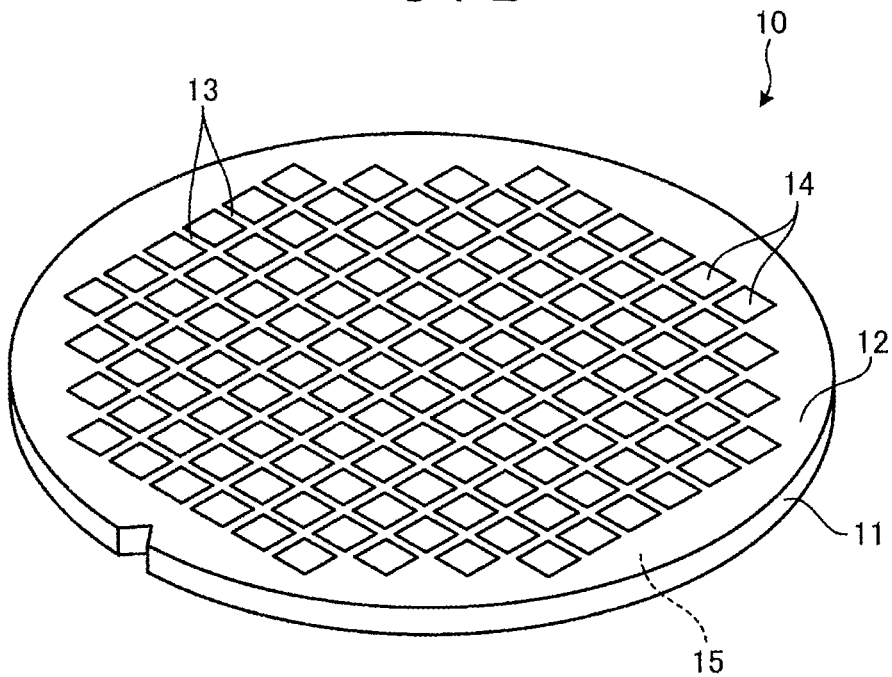
FIG. 1 is a perspective view depicting an example of a wafer as an object of processing by a processing method according to an embodiment for the wafer.

About a processing method according to the embodiment of the present invention for a wafer 10, a description will first be made based on FIGS. 1 to 9. The configuration of the wafer 10 as an object of processing in this embodiment will first be described. FIG. 1 is a perspective view depicting an example of the wafer 10 as the object of processing by the processing method of this embodiment for the wafer 10.

As depicted in FIG. 1, the wafer 10 can be a disc-shaped semiconductor wafer, optical device wafer, or the like, which includes a substrate 11 of silicon (Si), sapphire ($Al_2O_3$), gallium arsenide (GaAs), silicon carbide (SiC), or the like. The wafer 10 has a plurality of dicing lines 13 (hereinafter referred to as "streets") set in a grid-pattern on a front surface 12 of the substrate 11, and devices 14 formed in regions defined by the streets 13.

The devices 14 are, for example, integrated circuits such as an integrated circuit (IC) or large scale integrations (LSI), or image sensors such as charge coupled devices (CCD) or complementary metal oxide semiconductors (CMOS). Another surface of the wafer 10, which is located on a side opposite to the front surface 12 where the devices 14 are formed, will be referred to as "back surface 15."

The wafer 10 is divided into the individual devices 14 along the streets 13, whereby device chips 19 (see FIG. 12) are manufactured. Incidentally, the device chips 19 may be rectangular, although they are square in this embodiment. In this embodiment, the substrate 11 is silicon of 8 inch diameter and 150 μm thickness, and the wafer 10 is singulated into the device chips 19 of 0.15 mm square.

Figure 2:
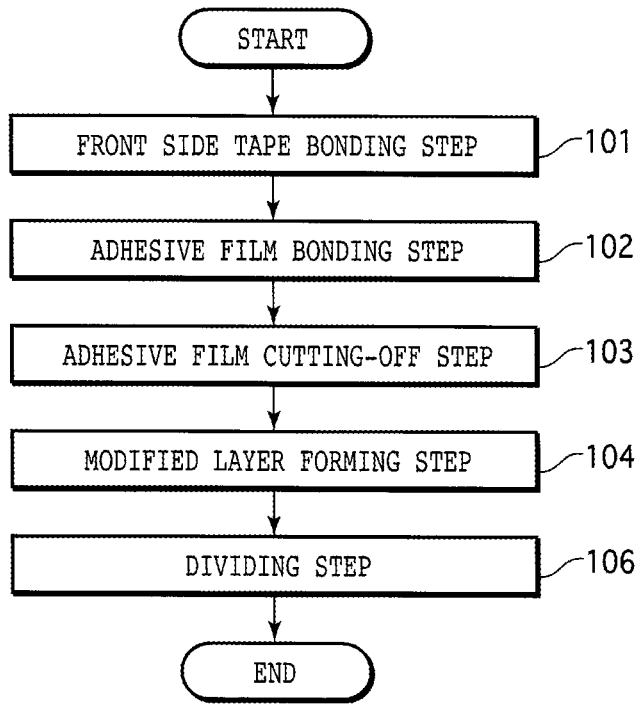
FIG. 2 is a flow chart illustrating a flow of the processing method according to the embodiment for the wafer.

A description will next be made of the processing method according to this embodiment for the wafer 10. FIG. 2 is a flow chart illustrating a flow of the processing method according to this embodiment for the wafer 10. As illustrated in FIG. 2, the processing method according to this embodiment for the wafer 10 includes a front side tape bonding step 101, an adhesive film bonding step 102, an adhesive film cutting-off step 103, a modified layer forming step 104, and a dividing step 106.

(Front Side Tape Bonding Step 101)

Figure 3:
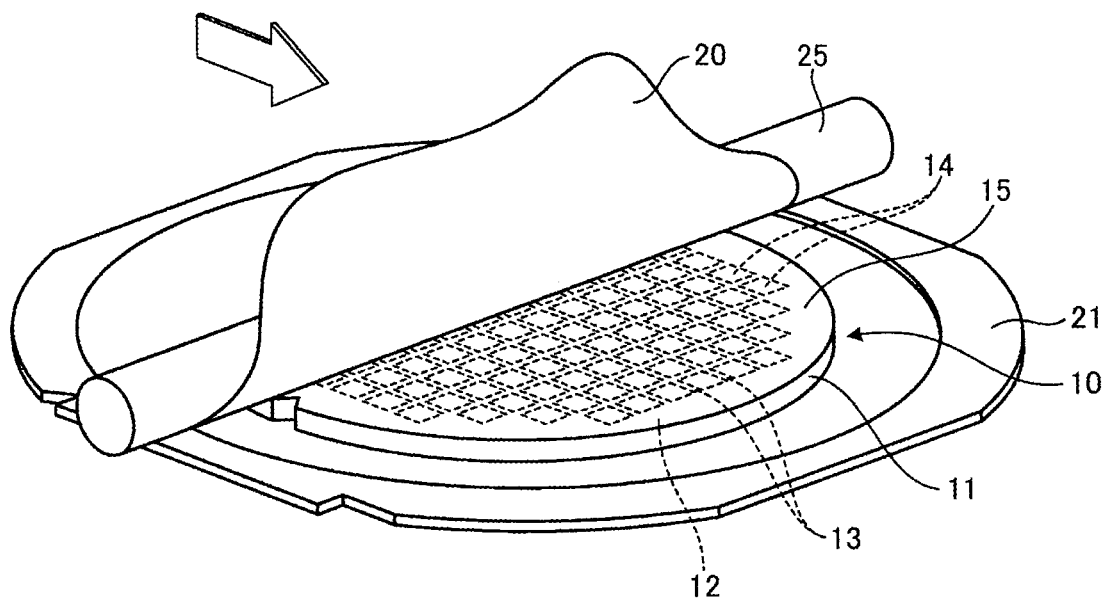
FIG. 3 is a perspective view illustrating an example of a front side tape bonding step illustrated in FIG. 2.
Figure 4:
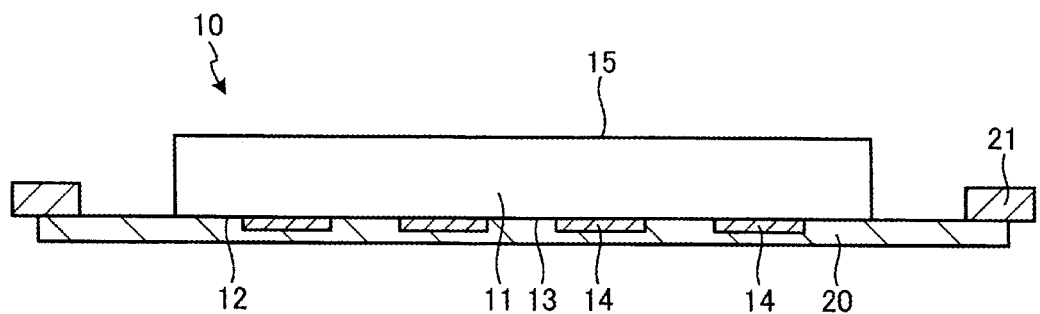
FIG. 4 is a cross-sectional view illustrating the wafer illustrated in FIG. 3.

FIG. 3 is a perspective view illustrating an example of the front side tape bonding step 101 illustrated in FIG. 2. FIG. 4 is a cross-sectional view illustrating the wafer 10 illustrated in FIG. 3. Incidentally, in the cross-sectional view of the wafer 10 as illustrated in FIG. 4 and its subsequent similar cross-sectional views, the streets 13 and the devices 14 are illustrated fewer in number but greater in size. The front side tape bonding step 101 bonds a front side tape 20 to a side of the front surface 12 of the wafer 10. In this embodiment, the front side tape bonding step 101 is performed before performance of the adhesive film bonding step 102. Incidentally, in the present invention, however, the front side tape bonding step 101 may also be performed after performance of the adhesive film bonding step 102, or may be omitted.

The front side tape 20 is an adhesive tape for fixing the wafer 10 on an annular frame 21, for example, a dicing tape. The front side tape 20 includes, for example, a base material layer formed of a synthetic resin, and an adhesive layer laminated on the base material layer and formed of a synthetic resin having adhesiveness. The frame 21 has an opening greater than an outer diameter of the wafer 10, and is formed of a metal, resin, or like material.

In the front side tape bonding step 101, the wafer 10 is first positioned at a predetermined location in the opening of the frame 21. The front side tape 20 is next bonded to a side of one surface of the frame 21 and also to the side of the front surface 12 of the wafer 10. Here, using a roller 25 illustrated in FIG. 3 or a like device, the front side tape 20 is brought into close contact with the side of the front surface 12 of the wafer 10, whereby the front side tape 20 is allowed to compensate for recesses of the streets 13 and projections of the devices 14. As a consequence, the wafer 10 is fixed on the front side tape 20 and the frame 21.

(Adhesive Film Bonding Step 102)

Figure 5:
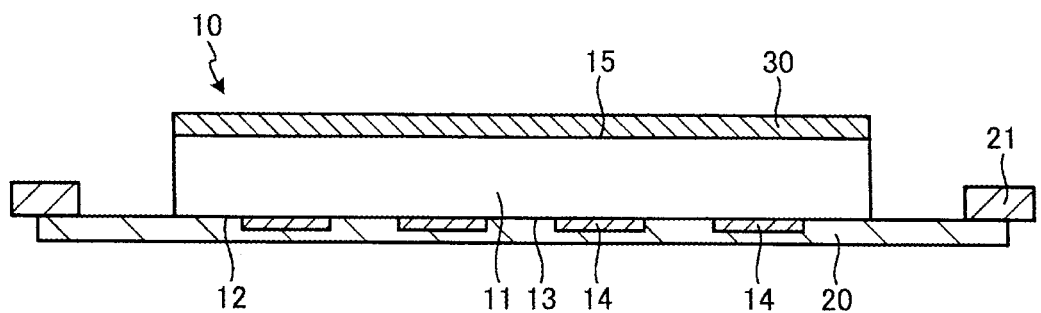
FIG. 5 is a cross-sectional view of the wafer after an adhesive film bonding step illustrated in FIG. 2.

FIG. 5 is a cross-sectional view illustrating the wafer 10 after the adhesive film bonding step 102 illustrated in FIG. 2. The adhesive film bonding step 102 bonds an adhesive film 30 to a side of the back surface 15 of the wafer 10. Incidentally, in this embodiment, the adhesive film bonding step 102 is performed after performance of the front side tape bonding step 101. In the present invention, however, the adhesive film bonding step 102 may also be performed before performance of the front side tape bonding step 101.

The adhesive film 30 is an insulating adhesive member formed of a resin having adhesiveness. The adhesive film 30 is used to fix desired ones of the device chips 19 (see FIG. 12), which have been divided and singulated subsequent to the division of the wafer 10 into the individual devices 14, on a mounting board (for example, a mounting board 40 illustrated in FIG. 13). The adhesive film 30 has an outer diameter that is substantially equal to the outer diameter of the wafer 10.

In the adhesive film bonding step 102, the adhesive film 30, as illustrated in FIG. 5, is bonded to the front side tape 20 and the side of the back surface 15 of the wafer 10 fixed on the frame 21, and is maintained in close contact with the back surface 15 of the wafer 10 with substantially the entirety of the back surface 15 of the wafer 10 covered by the adhesive film 30.

(Adhesive Film Cutting-Off Step 103)

Figure 6:
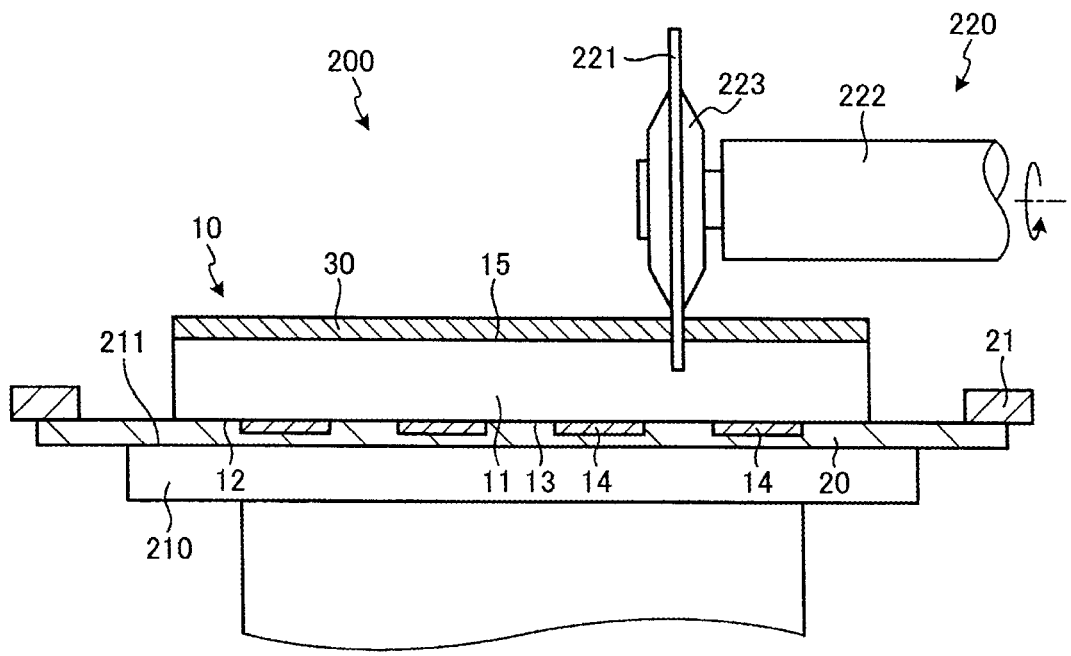
FIG. 6 is a side view illustrating partly in cross-section a cutting-off operation in an example of the adhesive film cutting-off step illustrated in FIG. 2.

FIG. 6 is a side view illustrating partly in cross-section a cutting-off operation in an example of the adhesive film cutting-off step 103 illustrated in FIG. 2. The adhesive film cutting-off step 103 cuts off the adhesive film 30, which is bonded on the side of the back surface 15 of the wafer 10, along the streets 13 from the side of the back surface 15 of the wafer 10. Incidentally, in this embodiment, the adhesive film cutting-off step 103 is performed before performance of the modified layer forming step 104. In the present invention, however, the adhesive film cutting-off step 103 may also be performed after performance of the modified layer forming step 104.

In the adhesive film cutting-off step 103 illustrated in FIG. 6, the adhesive film 30 is cut off by a cutting machine 200. The cutting machine 200 includes a chuck table 210 formed from a transparent body, a cutting unit 220, an unillustrated moving unit that relatively moves the chuck table 210 and the cutting unit 220, and an unillustrated imaging unit.

The cutting unit 220 includes a disc-shaped cutting blade 221, a spindle 222 that serves as an axis of rotation of the cutting blade 221, and a mount flange 223 that is fitted on the spindle 222 and carries the cutting blade 221 fixed thereon. The cutting blade 221 and the spindle 222 have an axis of rotation that is parallel to a holding surface 211 of the chuck table 210 on which the wafer 10 is held as an object of cutting. The cutting blade 221 is fitted on a distal end of the spindle 222.

In the adhesive film cutting-off step 103 illustrated in FIG. 6, the wafer 10 is first held on the side of the front surface 12 thereof under suction on the holding surface 211 of the chuck table 210 via the front side tape 20. Here, the frame 21 is fixed by unillustrated clamp members or the like with the frame 21 pulled downward beyond the front surface 12 of the wafer 10, whereby the front surface 12 of the wafer 10 is fixed on the holding surface 211 of the chuck table 210 via the front side tape 20.

In the adhesive film cutting-off step 103 illustrated in FIG. 6, an alignment is next performed between the cutting unit 220 and the wafer 10. Described specifically, an unillustrated moving unit moves the chuck table 210 to a processing region underneath the cutting unit 220, and the wafer 10 is imaged by an unillustrated imaging unit to perform the alignment, whereby a processing point of the cutting blade 221 is brought into alignment with desired one of the streets 13 of the wafer 10. As the wafer 10 is now held on the side of its front surface 12, where the streets 13 are included, on the holding surface 211 of the chuck table 210 via the front side tape 20, the imaging unit images the wafer 10 across the chuck table 210, which formed from the transparent body, and the front side tape 20. If the imaging unit includes an infrared camera and the streets 13 can be identified by the infrared camera from a side of the chuck table 210 across the front side tape 20, the chuck table 210 is not required to be a transparent body.

In the adhesive film cutting-off step 103 illustrated in FIG. 6, a supply of cutting water is next started toward the back surface 15 of the wafer 10. While relatively moving the chuck table 210 and the cutting blade 221 of the cutting unit 220 along the streets 13 by the unillustrated moving unit, the cutting blade 221 is next caused to cut in until the cutting blade 221 reaches the back surface 15 of the wafer 10 or grooves of a predetermined cut-in depth are formed in the wafer 10, whereby the adhesive film 30 is cut off.

In the adhesive film cutting-off step 103, it is sufficient if at least the adhesive film 30 is cut off. However, the adhesive film 30 may be processed together with the wafer 10. If this is the case, it is preferred to set a remaining uncut thickness at 50 μm or greater from the side of the front surface 12 of the wafer 10.

Figure 7:
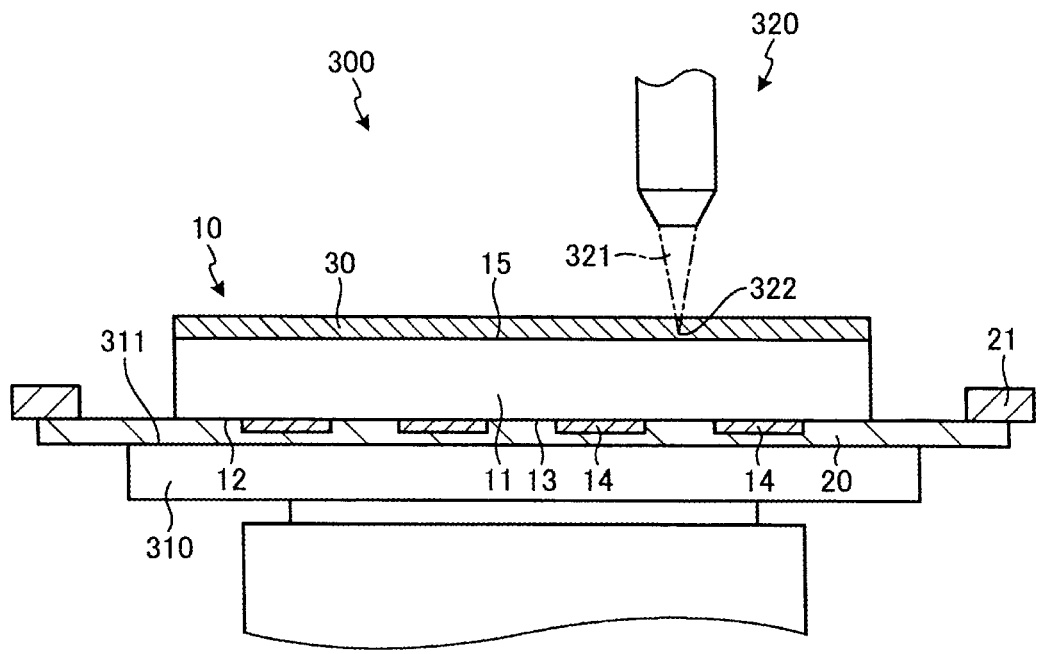
FIG. 7 is a side view illustrating partly in cross-section a cutting-off operation in another example of the adhesive film cutting-off step illustrated in FIG. 2.

In the adhesive film cutting-off step 103, the adhesive film 30 may be cut off by a pulsed laser beam 321. FIG. 7 is a side view illustrating partly in cross-section a cutting-off operation in another example of the adhesive film cutting-off step 103 illustrated in FIG. 2.

In the adhesive film cutting-off step 103 illustrated in FIG. 7, the adhesive film 30 is cut off by a laser processing machine 300. The laser processing machine 300 includes a chuck table 310 formed from a transparent body, a laser beam irradiation unit 320, an unillustrated moving unit that relatively moves the chuck table 310 and the laser beam irradiation unit 320, and an unillustrated imaging unit.

In the adhesive film cutting-off step 103 illustrated in FIG. 7, the wafer 10 is first held on the side of the front surface 12 thereof under suction on a holding surface 311 of the chuck table 310 via the front side tape 20. Here, the frame 21 is fixed by unillustrated clamp members or the like with the frame 21 pulled downward beyond the front surface 12 of the wafer 10, whereby the front surface 12 of the wafer 10 is fixed on the holding surface 311 of the chuck table 310 via the front side tape 20.

In the adhesive film cutting-off step 103 illustrated in FIG. 7, an alignment is next performed between the laser beam irradiation unit 320 and the wafer 10. Described specifically, the unillustrated moving unit moves the chuck table 310 to a processing position, and the wafer 10 is imaged by the unillustrated imaging unit to perform the alignment, whereby an irradiation portion of the laser beam irradiation unit 320 is brought into alignment with desired one of the streets 13 of the wafer 10. As the wafer 10 is now held on the side of its front surface 12, where the streets 13 are included, on the holding surface 311 of the chuck table 310 via the front side tape 20, the imaging unit images the wafer 10 across the chuck table 310, which is formed from the transparent body, and the front side tape 20. Incidentally, if the imaging unit includes an infrared camera and the streets 13 can be identified by the infrared camera from a side of the chuck table 310 across the front side tape 20, the chuck table 310 is not required to be a transparent body.

In the adhesive film cutting-off step 103 illustrated in FIG. 7, while moving the chuck table 310 relative to the laser beam irradiation unit 320, the pulsed laser beam 321 is irradiated from the side of the back surface 15 of the wafer 10 with a condensing point 322 positioned at the adhesive film 30 bonded on the wafer 10. The laser beam 321 is of a wavelength having absorption in the adhesive film 30. Described specifically, with the condensing point 322 positioned at or in a vicinity of a surface of the adhesive film 30, the laser beam 321 is irradiated along the streets 13, whereby the adhesive film 30 is cut off along the streets 13.

(Modified Layer Forming Step 104)

Figure 8:
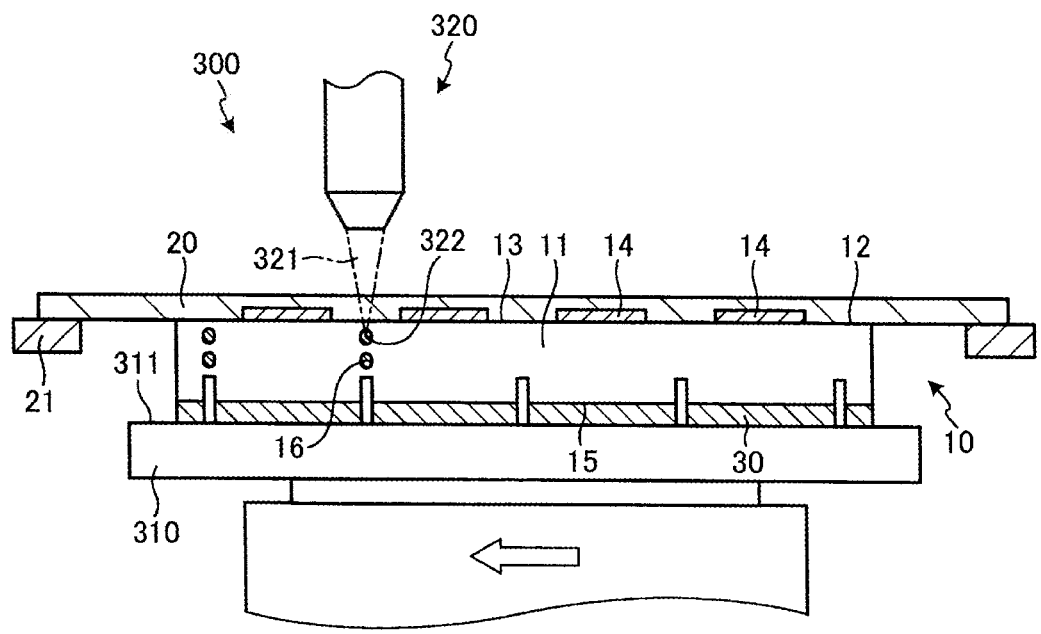
FIG. 8 is a side view illustrating partly in cross-section a forming operation in a modified layer forming step illustrated in FIG. 2.

FIG. 8 is a side view illustrating partly in cross-section a forming operation in the modified layer forming step 104 illustrated in FIG. 2. The modified layer forming step 104 forms modified layers 16 inside the wafer 10 along the streets 13. In this embodiment, the modified layer forming step 104 is performed after performance of the adhesive film cutting-off step 103. In the present invention, however, the modified layer forming step 104 may also be performed before performance of the adhesive film cutting-off step 103.

The modified layers 16 mean regions changed into a different state of density, refractive index, mechanical strength, or other physical property from that of surroundings. The modified layers 16 are each a region which is, for example, a fusion processed region, a cracked region, an electrical breakdown region, a refractive index change region, a region where these regions exist mixed together, or the like. The modified layers 16 are lower in mechanical strength or the like than the remaining portions of the wafer 10.

As illustrated in FIG. 8, the modified layers 16 are formed by applying stealth dicing with the laser beam 321 in the modified layer forming step 104. The laser beam 321 is of a wavelength having transmissivity through the wafer 10. Incidentally, in this embodiment, the front side tape 20 is bonded on the side of the front surface 12 of the wafer 10 in the front side tape bonding step 101. Therefore, the laser beam 321 is hence of a wavelength having transmissivity through the front side tape 20 and the wafer 10.

In the modified layer forming step 104, the wafer 10 is first held on the side of the back surface 15 thereof under suction on the chuck table 310 via the adhesive film 30. The chuck table 310 is next moved to a processing position by the unillustrated moving unit. The wafer 10 is then imaged by the unillustrated imaging unit, whereby the streets 13 are detected. After the detection of the streets 13, an alignment is performed between a desired one of the streets 13 on the wafer 10 and the irradiation portion of the laser beam irradiation unit 320.

In the modified layer forming step 104, while moving the chuck table 310 relative to the laser beam irradiation unit 320, the pulsed laser beam 321 is next irradiated from the side of the front surface 12 of the wafer 10 across the front side tape 20 with the condensing point 322 positioned inside the wafer 10. In the modified layer forming step 104, the laser beam 321 is irradiated along the streets 13 with the condensing point 322 positioned inside the wafer 10, whereby as illustrated in FIG. 8, the modified layers 16 are formed along the streets 13 inside the substrate 11. Therefore, the modified layers 16 are formed along cut-off lines of the adhesive film 30 cut off in the adhesive film cutting-off step 103.

(Dividing Step 106)

Figure 9:
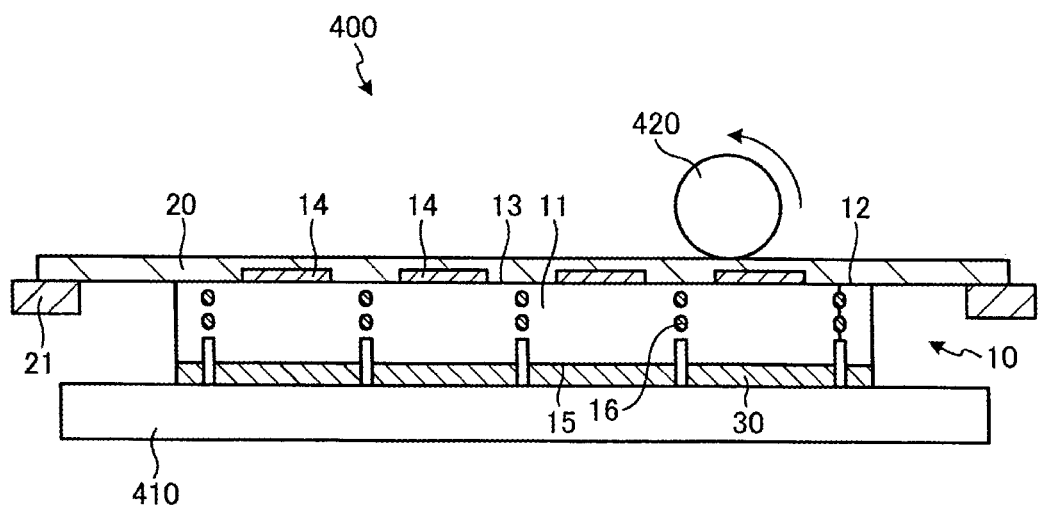
FIG. 9 is a side view illustrating partly in cross-section a dividing operation in a dividing step illustrated in FIG. 2.

FIG. 9 is a side view illustrating partly in cross-section a dividing operation in a dividing step 106 illustrated in FIG. 2. The dividing step 106 is performed after the performance of the adhesive film cutting-off step 103 and the modified layer forming step 104. The dividing step 106 divides the wafer 10 from the modified layers 16 as starting points by applying an external force to the wafer 10.

As illustrated in FIG. 9, the external force is applied to the wafer 10 by a breaking unit 400 in the dividing step 106 in this embodiment. Described specifically, the dividing step 106 of this embodiment includes a breaking step, in which with the wafer 10 kept pressed by a breaking roller 420 via the front side tape 20 on the wafer 10, a breaking roller 420 is rolled, thereby dividing the wafer 10 from the modified layers 16 as the starting points. The breaking unit 400 includes a resin pad 410 on which the wafer 10 is mounted, and the breaking roller 420.

In the dividing step 106, the wafer 10 is first mounted on the side of its back surface 15 on the resin pad 410 via the adhesive film 30. While pressing the wafer 10 by the breaking roller 42 via the front side tape 20 on the wafer 10, the breaking roller 420 is next rolled and moved. In other words, the breaking roller 420 is rolled on the front side tape 20 of the wafer 10 while pressing the breaking roller 420 toward the wafer 10.

As a consequence, an external force is applied to the wafer 10, whereby cracks spread out from the modified layers 16. By linkage of the cracks with the modified layers 16, the wafer 10 is divided from the modified layers 16 as the starting points. As the adhesive film 30 has already been cut off along the streets 13 in the adhesive film cutting-off step 103, the wafer 10 is now singulated into device chips with the adhesive film 30 bonded to the back surfaces 15 of the individual device chips.

Figure 10:
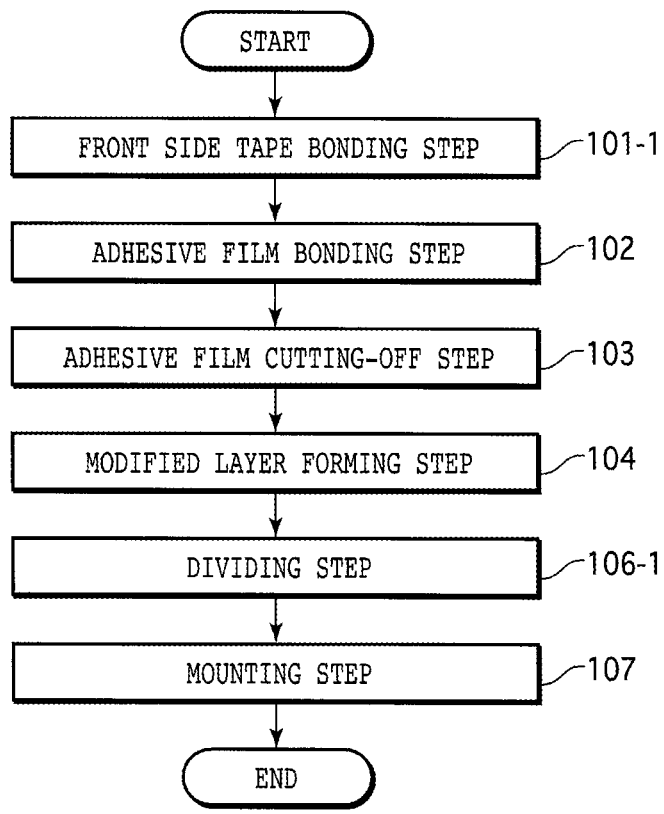
FIG. 10 is a flow chart illustrating a flow of a processing method according to a first modification for the wafer.

A description will next be made about a processing method according to a first modification for the wafer 10. FIG. 10 is a flow chart illustrating a flow of the processing method according to the first modification for the wafer 10. The processing method according to the first modification for the wafer 10, as illustrated in FIG. 10, includes a front side tape bonding step 101-1, the adhesive film bonding step 102, the adhesive film cutting-off step 103, the modified layer forming step 104, a dividing step 106-1, and a mounting step 107. Note that the procedures of the adhesive film bonding step 102, the adhesive film cutting-off step 103, and the modified layer forming step 104 in the first modification are similar to those in the embodiment, and their description is omitted accordingly.

(Front Side Tape Bonding Step 101-1)

Compared with the front side tape 20 in the embodiment, a front side tape 20-1, which is bonded to the side of the front surface 12 of the wafer 10 in the front side tape bonding step 101-1 in the first modification, is different in that the front side tape 20-1 has stretchability. The procedures of the front side tape bonding step 101-1 in the first modification are similar to those of the front side tape bonding step 101 in the embodiment, and their description is omitted accordingly.

(Dividing Step 106-1)

Figure 11:
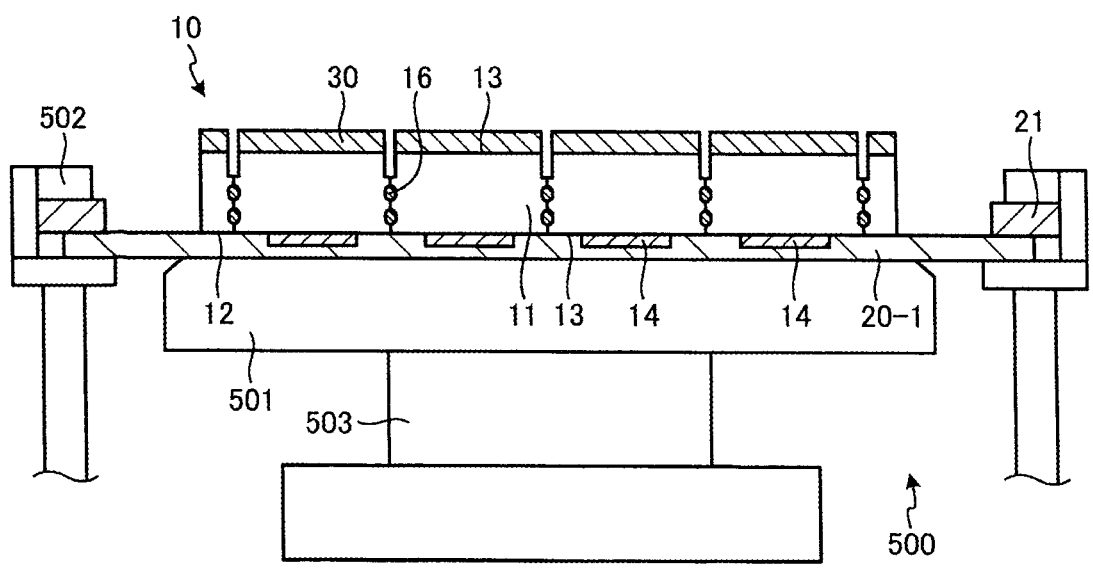
FIG. 11 is a side view illustrating partly in cross-section a frame fixing operation in a dividing step illustrated in FIG. 10.
Figure 12:
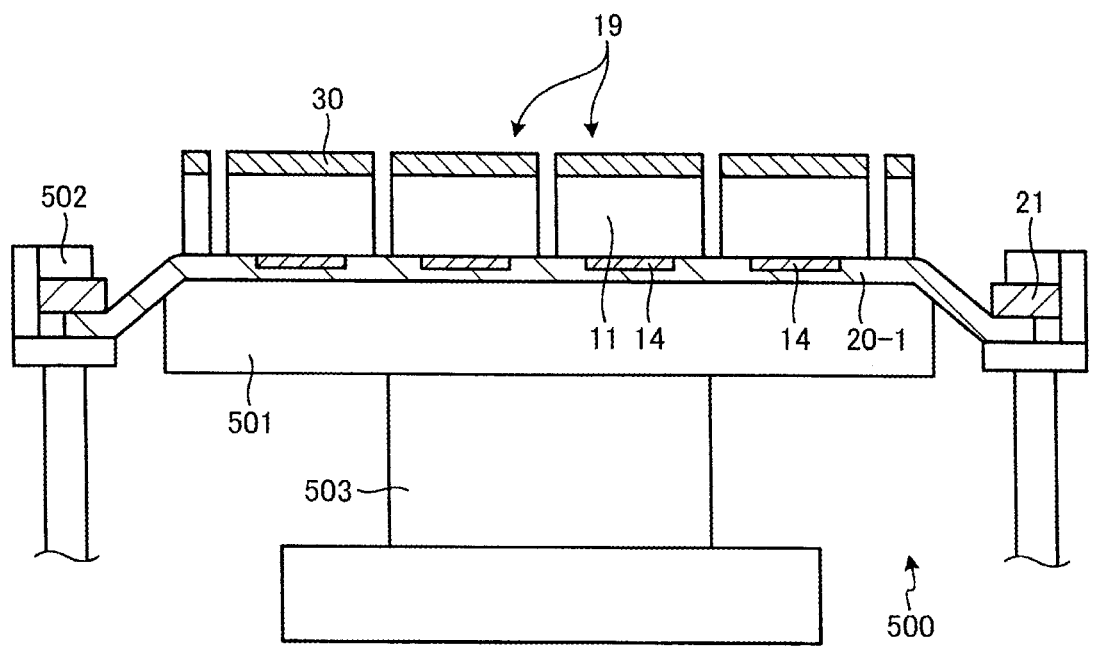
FIG. 12 is a side view illustrating partly in cross-section a front side tape expanding operation after the frame fixing operation of FIG. 11 in the dividing step illustrated in FIG. 10.

FIG. 11 is a side view illustrating partly in cross-section a frame fixing operation in the dividing step 106-1 illustrated in FIG. 10. FIG. 12 is a side view illustrating partly in cross-section a front side tape expanding operation after the frame fixing operation of FIG. 11 in the dividing step 106-1 illustrated in FIG. 10. The dividing step 106-1 in the first modification includes an expanding step, in which the front side tape 20-1 on the wafer 10 is expanded to divide the wafer 10 into the device chips 19 from the modified layers 16 as the starting points.

As illustrated in FIGS. 11 and 12, an external force is applied in a planar direction and in a radial direction to the front side tape 20-1 by an expanding unit 500 in the dividing step 106-1 in the first modification. The expanding unit 500 includes a chuck table 501, clamp portions 502, and a lift unit 503.

In the dividing step 106-1, the wafer 10, as illustrated in FIG. 11, is first mounted on the side of the front surface 12 thereof on a holding surface of the chuck table 501 via the front side tape 20-1, and the frame 21 is fixed at an outer peripheral portion thereof by the clamp portions 502. As illustrated in FIG. 12, the chuck table 501 is next raised by the lift unit 503. Here, the front side tape 20-1 is expanded in a planar direction at a portion thereof between an inner edge of the frame 21 and an outer edge of the wafer 10 because the front side tape 20-1 is fixed at an outer peripheral portion thereof by the clamp portions 502 via the frame 21.

In the dividing step 106-1, as a result of the expansion of the front side tape 20-1, a tensile force is radially applied to the front side tape 20-1. Upon application of the radial tensile force to the front side tape 20-1, the wafer 10 with the front side tape 20-1 bonded thereon is divided, as illustrated in FIG. 12, from modified layers 16, which are formed as starting points along the streets 13, into the individual devices 14 one by one, followed by singulation into the device chips 19 one after one.

(Mounting Step 107)

Figure 13:
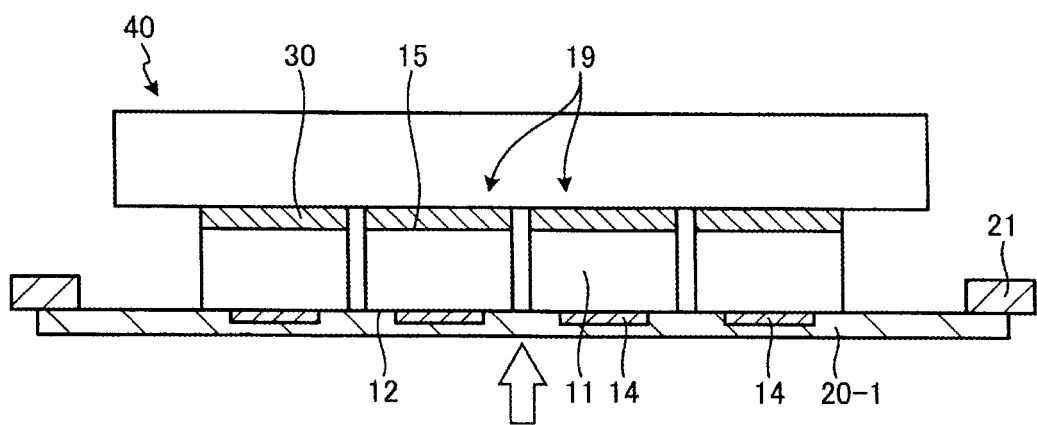
FIG. 13 is a side view illustrating partly in cross-section a mounting operation in a mounting step illustrated in FIG. 10.

FIG. 13 is a side view illustrating partly in cross-section a mounting operation in the mounting step 107 illustrated in FIG. 10. The mounting step 107 mounts desired ones of the device chips 19 (hereinafter referred to as "the desired device chips 19") onto the mounting board 40 by the adhesive film 30 arranged on the side of the back surfaces 15 of the desired device chips 19.

In the mounting step 107 in the first modification, the desired device chips 19 are not picked up from the front side tape 20-1. Instead, the mounting board 40, on which the desired device chips 19 are to be mounted, is first provided at a position, where the mounting board 40 faces the desired device chips 19 supported on the front side tape 20-1. The desired device chips 19 are then pressed toward the mounting board 40 via the front side tape 20-1. As a consequence, the desired device chips 19 are mounted onto the mounting board 40 by the adhesive film 30 arranged on the side of the back surfaces 15 of the desired device chips 19.

Figure 14:
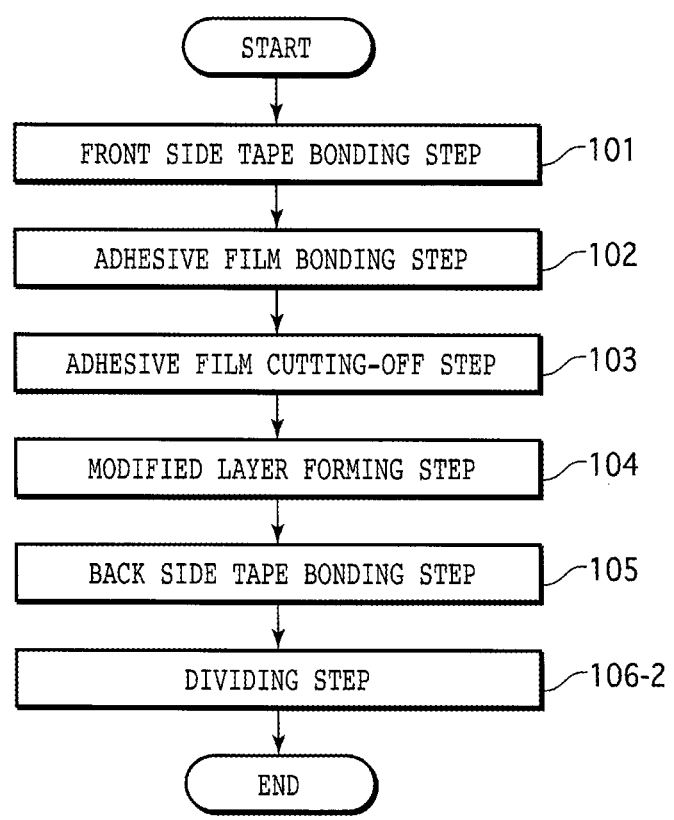
FIG. 14 is a flow chart illustrating a flow of a processing method according to a second modification for the wafer.

A description will next be made about a processing method according to a second modification for the wafer 10. FIG. 14 is a flow chart illustrating a flow of the processing method according to the second modification for the wafer 10. The processing method according to the second modification for the wafer 10, as illustrated in FIG. 14, includes the front side tape bonding step 101, the adhesive film bonding step 102, the adhesive film cutting-off step 103, the modified layer forming step 104, a back side tape bonding step 105, and a dividing step 106-2. Note that the procedures of the front side tape bonding step 101, the adhesive film bonding step 102, the adhesive film cutting-off step 103, and the modified layer forming step 104 in the second modification are similar to those in the embodiment, and their description is omitted accordingly.

(Back Side Tape Bonding Step 105)

Figure 15:
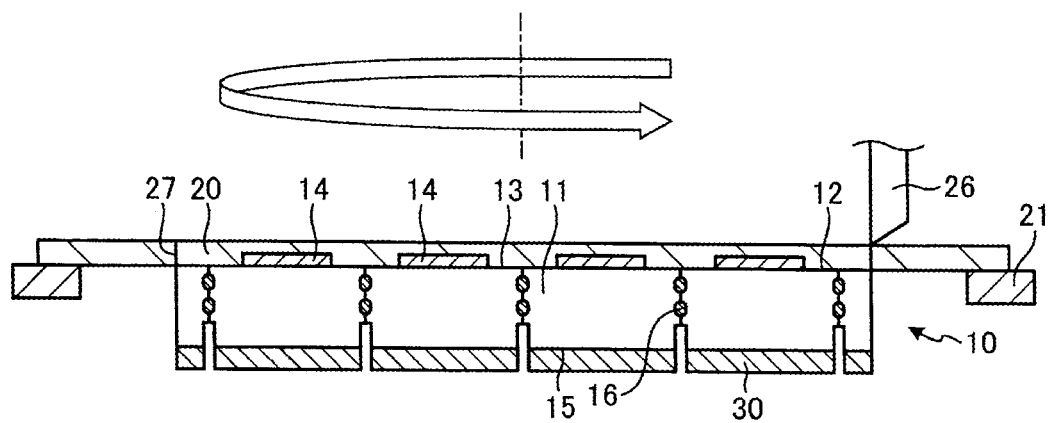
FIG. 15 is a cross-sectional view illustrating a front side tape cutting-off operation in a back side tape bonding step illustrated in FIG. 14.
Figure 16:
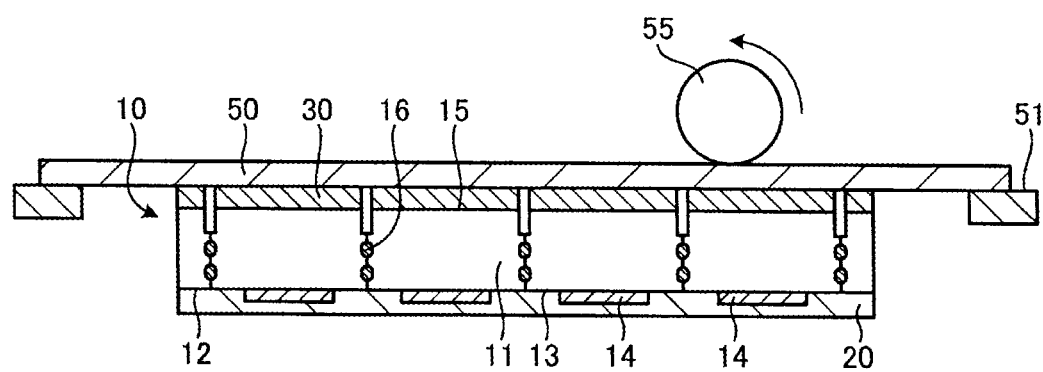
FIG. 16 is a cross-sectional view illustrating a back side tape bonding operation after the front side tape cutting-off operation of FIG. 15 in the back side tape bonding step illustrated in FIG. 14.

FIG. 15 is a cross-sectional view illustrating a front side tape cutting-off operation in the back side tape bonding step 105 illustrated in FIG. 14. FIG. 16 is a cross-sectional view illustrating a back side tape bonding operation after the front side tape cutting-off operation of FIG. 15 in the back side tape bonding step 105 illustrated in FIG. 14. The back side tape bonding step 105 is performed after the performance of at least the adhesive film cutting-off step 103. In the second modification, the back side tape bonding step 105 is performed after performance of the modified layer forming step 104. The back side tape bonding step 105 bonds a back side tape 50 to the side of the back surface 15 of the wafer 10 via the adhesive film 30.

In the processing method according to the second modification for the wafer 10, the front side tape 20 is bonded to the side of the front surface 12 of the wafer 10 in the front side tape bonding step 101 before the back side tape bonding step 105. Accordingly, in the back side tape bonding step 105 in the second modification, the back side tape 50 is bonded to the side of the back surface 15 of the wafer 10 via the adhesive film 30, and at the same time the front side tape 20 is removed from the wafer 10.

The back side tape 50 is an adhesive tape for dividing the wafer 10 through its expansion in a planar direction in the dividing step 106-2 to be described subsequently herein. The back side tape 50 has stretchability. The back side tape 50 includes, for example, a base material layer formed of a synthetic resin, and an adhesive layer laminated on the base material layer and formed of a synthetic resin having adhesiveness.

In the back side tape bonding step 105, the front side tape 20 is first cut off along an outer peripheral edge of the wafer 10 as illustrated in FIG. 15. Described more specifically, the wafer 10 is rotated about its axis of rotation, for example, with a cutter 26 or the like maintained in contact with the front side tape 20 at the outer peripheral edge of the wafer 10. As a consequence, an outer peripheral portion of the front side tape 20, the outer peripheral portion being a portion on a radially outer side of a cutting line 27 illustrated in FIG. 15 and including a portion where the front side tape 20 is bonded on the frame 21, is cut off together with the frame 21 from a remaining portion of the front side tape 20, the remaining portion being bonded on the front surface 12 of the wafer 10.

In the back side tape bonding step 105, as illustrated in FIG. 16, the back side tape 50 and a frame 51 are next provided at positions where the back side tape 50 and the frame 51 face the back surface 15 of the wafer 10. The frame 51 has an opening greater than the outer diameter of the wafer 10, and is formed of a metal, resin or like material. The back side tape 50 is next bonded to a side of a surface of the frame 51, the surface being on a side opposite to a surface where the frame 51 faces the wafer 10, and is also bonded to the side of the back surface 15 of the wafer 10 via the adhesive film 30. Here, using a roller 55 illustrated in FIG. 16 or a like device, the back side tape 50 is brought into close contact with the side of the back surface 15 of the wafer 10 via the adhesive film 30. The front side tape 20 is then separated from the side of the front surface 12 of the wafer 10.

(Dividing Step 106-2)

The dividing step 106-2 in the second modification includes an expanding step, in which the back side tape 50 on the wafer 10 is expanded to divide the wafer 10 from the modified layers 16 as staring points into the device chips 19. Compared with the dividing step 106-1 in the first modification, the dividing step 106-2 in the second modification is different in that instead of the front side tape 20-1, the back side tape 50 is expanded to divide the wafer 10 into the device chips 19.

In the dividing step 106-2 in the second modification, the wafer 10 is fixed on the side of the back surface 15 thereof via the back side tape 50 when fixing the wafer 10 on the expanding unit 500 illustrated in FIGS. 11 and 12. In the dividing step 106-2 in the second modification, procedures other than those described above are similar to those of the dividing step 106-1 in the first modification, and their description is omitted accordingly.

Incidentally, in the processing method of the second modification for the wafer 10, an external force may be applied to the wafer 10 by the breaking unit 400 in the dividing step 106-2 as in the diving step 106 of the embodiment as illustrated in FIG. 9. Described specifically, the dividing step 106-2 may include a breaking step, in which with the wafer 10 kept pressed via the back side tape 50 on the wafer 10 by the breaking roller 420, the breaking roller 420 is rolled, thereby dividing the wafer 10 from the modified layers 16 as the starting points. If this is the case, the back side tape 50 bonded in the back side tape bonding step 105 is not required to have stretchability.

As described hereinabove, the processing methods of the embodiment and the respective modifications do not use a generally-called two-in-one adhesive film that a DAF, i.e., a die-bonding adhesive film and an expandable sheet are integrated together, but are configured to bond the die-bonding adhesive film to one surface (the back surface 15) of the wafer 10 and to bond the dicing tape to the other surface (the front surface 12) of the wafer 10. Owing to this configuration, the adhesive film can be processed from one side, and stealth dicing can be applied to the wafer 10 from the other side. Different from the conventional method that breaks the DAF through an expansion of the expandable sheet, the DAF can be surely broken irrespective the size of the devices 14.

Note that the present invention should not be limited to the embodiment and the first and second modifications described above. In other words, the present invention can be practiced with various modifications within a scope not departing from the spirit of the present invention. In the modified layer forming step 104, for example, the laser beam 321, in the embodiment, is irradiated from the side of the front surface 12 of the wafer 10 with the laser beam 321 focused in the wafer 10. However, the laser beam 321 may be irradiated from the side of the back surface 15 of the wafer 10 with the laser beam 321 focused in the wafer 10.

If the modified layers 16 are formed from the side of the back surface 15 of the wafer 10, the adhesive film 30, for example, may be bonded to the back surface 15 of the wafer 10 after formation of the modified layers 16, or the laser beam 321, for example, may be irradiated across the adhesive film 30 after the adhesive film 30 is bonded to the back surface 15 of the wafer 10. Further, after the modified layers 16 are formed from the side of the back surface 15, the back surface 15 of the wafer 10 may be subjected to grinding processing before bonding the adhesive film 30 to the back surface 15 of the wafer 10. It is also preferred to bond, after the adhesive film cutting-off step 103 in which the adhesive film 30 is cut off, the back side tape 50 for the purpose of division as in the second modification. In these alternatives, the wafer 10 is processed from the side of the back surface 15 thereof in both the adhesive film cutting-off step 103 and the modified layer forming step 104, thereby bringing about an advantageous effect that the labor of reversing the front and back sides of the wafer 10 can be obviated.

In the dividing steps 106, 106-1, and 106-2 in the embodiment and the respective embodiments, either the breaking step or the expanding step is included, although they may be both included. In particular, by performing the expanding step to widen intervals between the device chips after performance of the breaking step, the device chips can be suitably picked up even if they have a small size.

The present invention is not limited to the details of the above-described preferred embodiment and modifications. The scope of the invention is defined by the appended claims and all changes and modifications as fall within the equivalence of the scope of the claims are therefore to be embraced by the invention.

What is claimed is:

1. A wafer processing method for processing a wafer having devices in respective regions defined by a plurality of intersecting streets on a front surface of the wafer, the wafer processing method comprising:
   an adhesive film bonding step of bonding an adhesive film on a side of a back surface of the wafer;
   an adhesive film cutting-off step of cutting off at least the adhesive film that is bonded on the side of the back surface of the wafer along the plurality of intersecting streets from the side of the back surface of the wafer;
   a modified layer forming step of irradiating a laser beam of a wavelength that has transmissivity through the wafer with the laser beam focused inside the wafer, so that modified layers are formed along the plurality of intersecting streets, respectively; and
   a dividing step of, after performing the adhesive film cutting-off step and the modified layer forming step, applying an external force to the wafer so that the wafer is divided from the modified layers as starting points.

2. The wafer processing method according to claim 1, further comprising:
   a front side tape bonding step of bonding a front side tape to a side of a front surface of the wafer, before or after the adhesive film bonding step.

3. The wafer processing method according to claim 2, wherein,
   in the modified layer forming step, a laser beam of a wavelength that has transmissivity through the front side tape and the wafer is irradiated from the side of the front surface of the wafer across the front side tape.

4. The wafer processing method according to claim 2, wherein:
   the dividing step includes a breaking step of rolling and moving a breaking roller while pressing the wafer by the breaking roller via the front side tape on the wafer so that the wafer is divided from the modified layers as the starting points.

5. The wafer processing method according to claim 2, wherein;
   the front side tape has stretchability, and
   the dividing step includes an expanding step of expanding the front side tape on the wafer so that the wafer is divided into device chips from the modified layers as the starting points.

6. The wafer processing method according to claim 5, further comprising:
   a mounting step of providing a mounting board, on which desired ones of the device chips are to be mounted, at a position where the mounting board faces the desired ones of the device chips, and pressing the desired ones of the device chips toward the mounting board via the front side tape so that the desired ones of the device chips are mounted onto the mounting board by the adhesive film arranged on a side of back surfaces of the desired ones of the device chips.

7. The wafer processing method according to claim 1, further comprising:
   a back side tape bonding step of, after performance of the adhesive film cutting-off step, bonding a back side tape to the side of the back surface of the wafer via the adhesive film.

8. The wafer processing method according to claim 7, wherein:
   the dividing step includes a breaking step of rolling and moving a breaking roller while pressing the wafer by the breaking roller via the back side tape on the wafer so that the wafer is divided from the modified layers as the starting points.

9. The wafer processing method according to claim 7, wherein:
   the back side tape has stretchability, and
   the dividing step includes an expanding step of expanding the back side tape on the wafer so that the wafer is divided into device chips from the modified layers as the starting points.

* * * * *